(12) United States Patent
Peter et al.

(10) Patent No.: US 9,199,874 B2
(45) Date of Patent: Dec. 1, 2015

(54) METHOD FOR DEPOSITING A THIN FILM, AND RESULTING MATERIAL

(75) Inventors: Emmanuelle Peter, Aix en Provence (FR); Andriy Kharchenko, Palaiseau (FR); Nicolas Nadaud, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 613 days.

(21) Appl. No.: 13/322,995

(22) PCT Filed: Jun. 4, 2010

(86) PCT No.: PCT/FR2010/051097
§ 371 (c)(1),
(2), (4) Date: Nov. 29, 2011

(87) PCT Pub. No.: WO2010/139908
PCT Pub. Date: Dec. 9, 2010

(65) Prior Publication Data
US 2012/0094075 A1    Apr. 19, 2012

(30) Foreign Application Priority Data
Jun. 5, 2009   (FR) ...................................... 09 53742

(51) Int. Cl.
*C03C 17/23*     (2006.01)
*C03C 17/245*    (2006.01)
(Continued)

(52) U.S. Cl.
CPC ............... *C03C 17/23* (2013.01); *C03C 17/245* (2013.01); *C03C 17/3441* (2013.01);
(Continued)

(58) Field of Classification Search
CPC .. C23C 14/086; C23C 14/5813; H01L 21/26; H01L 31/022466
See application file for complete search history.

(56) References Cited

U.S. PATENT DOCUMENTS 4,412,900 A * 11/1983 Tanaka et al. ............. 204/192.26
4,623,601 A * 11/1986 Lewis et al. ..................... 430/69
(Continued)

FOREIGN PATENT DOCUMENTS

DE    10 2007 052 782    5/2009
GB    2 428 689           2/2007
(Continued)

OTHER PUBLICATIONS

EPO Website Translation of DE 102007052782, May 7, 2009.*
(Continued)

*Primary Examiner* — Keith Hendricks
*Assistant Examiner* — Timon Wanga
(74) *Attorney, Agent, or Firm* — Oblon, McClelland, Maier & Neustadt, L.L.P.

(57) ABSTRACT

A method of obtaining a substrate coated on a first face with at least one transparent and electrically conductive thin layer based on at least one oxide, including depositing the at least one thin layer on the substrate and subjecting the at least one thin layer to a heat treatment in which the at least one layer is irradiated with aid of radiation having a wavelength between 500 and 2000 nm and focused on a zone of the at least one layer, at least one dimension of which does not exceed 10 cm. The radiation is delivered by at least one radiation device facing the at least one layer, a relative displacement being created between the radiation device and the substrate to treat the desired surface, the heat treatment being such that resistivity of the at least one layer is reduced during the treatment.

16 Claims, 2 Drawing Sheets

(51) Int. Cl.
*C03C 17/34* (2006.01)
*C03C 17/36* (2006.01)
*C23C 14/08* (2006.01)
*C23C 14/58* (2006.01)
*H01L 21/26* (2006.01)
*H01L 31/0224* (2006.01)

(52) U.S. Cl.
CPC .......... *C03C 17/3678* (2013.01); *C23C 14/086* (2013.01); *C23C 14/5813* (2013.01); *C03C 2217/94* (2013.01); *C03C 2218/32* (2013.01); *C03C 2218/355* (2013.01); *H01L 21/26* (2013.01); *H01L 31/022466* (2013.01); *Y10T 428/24364* (2015.01)

(56) References Cited

U.S. PATENT DOCUMENTS

| 5,413,959 | A* | 5/1995 | Yamamoto et al. | 438/98 |
| 2009/0042326 | A1* | 2/2009 | Yamazaki et al. | 438/29 |
| 2009/0124066 | A1* | 5/2009 | England et al. | 438/486 |
| 2009/0269892 | A1* | 10/2009 | Hatano et al. | 438/166 |
| 2010/0093182 | A1* | 4/2010 | Jitsuno et al. | 438/758 |

FOREIGN PATENT DOCUMENTS

| JP | 61-183813 A | 8/1986 |
| JP | 10-199346 A | 7/1998 |
| JP | 11 106935 | 4/1999 |
| JP | 2009-114478 A | 5/2009 |
| WO | WO 2008/129133 A1 | 10/2008 |

OTHER PUBLICATIONS

Kuo-Lung Fang, "Low Temperature Crystallization of Indium-tin-oxide", Proc. of ASID '06, Oct. 8-12, New Delhi.*

Sano, N., et al., "Activation of Implanted Boron Atoms in Silicon Wafers by Infrared Semiconductor Laser Annealing Using Carbon Films as Optical Absorption Layers," Japanese Journal of Applied Physics, vol. 46, No. 25, pp. L620-L622, (Jul. 1, 2007) XP001517833.

Nagase, T., et al., "A novel approach to prepare zinc oxide films: excimer laser irradiation of sol-gel derived precursor films," Thin Solid Films, vol. 357, pp. 151-158, (1999) XP002565783.

Narazaki, A., et al., "Improvement in Electrical Conductivity of Indium Tin Oxide Films Prepared via Pulsed Laser Deposition on Electric-Field-Applied Substrates," Japanese Journal of Applied Physics, vol. 41, No. 6A, Part 1, pp. 3760-3761, (Jun. 1, 2002) XP001163452.

International Search Report Issued Oct. 15, 2010 in PCT/FR10/051097 Filed Jun. 4, 2010.

U.S. Appl. No. 13/496,090, filed Mar. 14, 2012, Kharchenko, et al.

Office Action issued Feb. 25, 2014, in Japanese Patent Application No. 2012-513664 (submitting English translation only).

* cited by examiner

METHOD FOR DEPOSITING A THIN FILM, AND RESULTING MATERIAL

The invention relates to the field of inorganic thin layers, in particular deposited on substrates. It more particularly concerns a method of heat treating transparent electrically conductive thin layers with a view to reducing their resistivity, and to certain products obtained with the aid of this method.

Many thin layers are deposited on substrates, in particular made of flat or slightly convex glass, in order to impart particular properties to the materials obtained: optical properties, for example reflection or absorption of radiation in a given wavelength range, particular electrical conduction properties, or properties associated with ease of cleaning or the possibility for the material to self-clean.

Certain layers, generally based on semiconductive oxides, have the feature of being transparent but nevertheless electrically conductive. These layers are often referred to by their abbreviation "TCO", standing for "transparent conductive oxides". Their thickness generally varies from a few nanometers to a few hundreds of nanometers, which is why they are referred to as "thin". In the text, the term "transparent and electrically conductive layer based on at least one oxide" and the term "TCO-based layer" will be used equivalently.

Examples which may be mentioned are thin layers based on mixed oxides of indium and tin (called "ITO"), based on mixed oxides of indium and zinc (called "IZO"), based on zinc oxide doped with gallium or aluminum, based on titanium oxide doped with niobium, based on cadmium or zinc stannate, based on tin oxide doped with fluorine and/or antimony. These various layers are employed in numerous systems in which properties of transparency and electrical conductivity are necessary: liquid crystal screens (LCD), solar or photovoltaic collectors, electrochromic or electroluminescent devices, etc.

In a photovoltaic cell, a photovoltaic system comprising photovoltaic material, which produces electrical energy under the effect of incident radiation, is positioned between a rear face substrate and a front face substrate, this front face substrate being the first substrate through which the incident radiation passes before it reaches the photovoltaic material.

In the photovoltaic cell, the front face substrate usually comprises, below a main surface facing toward the photovoltaic material, a transparent electrode coating in electrical contact with the photovoltaic material arranged below, considering that the main arrival direction of the incident radiation is through the top.

In the case of photovoltaic materials based on silicon (for example amorphous or monocrystalline silicon), this front face electrode coating thus generally constitutes the negative terminal (or hole collector). Of course, the solar cell also comprises an electrode coating on the rear face substrate, which then constitutes the positive terminal (or electron collector) of the solar cell, but in general the electrode coating of the rear face substrate is not transparent. For photovoltaic materials based on cadmium telluride, the front face electrode coating generally constitutes the positive terminal of the solar cell.

Such TCO-based layers can therefore, by way of example, be used as front face electrode coatings.

Whatever the nature of the TCO-based layer or its application, it is generally desirable to maximize its conductivity and therefore minimize its resistivity.

The benefit of providing layers with a low resistivity is that the thickness of the layer can be reduced for a given resistance, or the resistance can be reduced compared with a layer of the same thickness.

Particularly in photovoltaic applications, and in order to obtain the desired low resistance (typically from 8 to 10 ohms), the TCO coating must be deposited with a relatively large physical thickness, of the order of 500 to 1000 nm and sometimes even more, which is expensive in view of the cost of these materials when they are deposited in thin layers.

Another major drawback of TCO coatings resides in the fact that for a chosen material, its physical thickness is always a compromise between electrical conduction and transparency, because the thickness is correlated with the conductivity but inversely correlated with the transparency. Now, high transparency is often required particularly in the field of photovoltaics, because it is important that as much radiation as possible can reach the cell. In particular, it is important for the layer to absorb as little as possible in the wavelength range in which the quantum efficiency of the photovoltaic cell in question is greatest. It will be recalled here that the quantum efficiency QE is, in a known fashion, the expression of the probability (between 0 and 1) that an incident photon with a given wavelength will be converted into an electron-hole pair. The maximum absorption wavelength $\lambda_m$, that is to say the wavelength at which the quantum efficiency is greatest, is of the order of 640 nm for cadmium telluride, 540 nm for amorphous silicon and of the order of 710 nm for monocrystalline silicon.

Any reduction of the thickness of the layer, for a constant resistance, is therefore advantageous whether for economic reasons or reasons of optical transmission.

One method commonly employed on the industrial scale for depositing thin layers, in particular on a glassware substrate, is the method of magnetic field enhanced cathode sputtering, known as the "magnetron" method. In this method, a plasma is created in a powerful vacuum in the vicinity of a target comprising the chemical elements to be deposited. By bombarding the target, the active species of the plasma extract said elements, which are deposited on the substrate so as to form the desired thin layer. This method is referred to as "reactive" when the layer consists of a material resulting from a chemical reaction between the elements extracted from the target and the gas contained in the plasma. The major advantage of this method resides in the possibility of depositing a highly complex stack of layers on the same line by successively passing the substrate under different targets, this generally being done in a single device.

During industrial use of the magnetron method, the substrate remains at room temperature or experiences a moderate temperature rise (less than 80° C.), particularly when the speed of advance of the substrate is high (which is generally desirable for economic reasons). However, what may seem to be an advantage then constitutes a drawback in the case of the aforementioned layers, because the low temperatures involved do not generally allow a sufficiently low resistivity to be obtained. Heat treatments then prove necessary in order to obtain the desired resistivity.

Possible heat treatments consist in heating the substrate either during the deposition or after the deposition, at the exit of the magnetron line. Most generally, temperatures of at least 200° C. or 300° C. are necessary.

However, heating the substrate in industrial magnetron lines (during the deposition) has proven hard to do, in particular because the heat transfers in a vacuum, necessarily of radiative nature, are difficult to control and involve a high cost in the case of large substrates, with a width of several meters. In the case of glass substrates with a small thickness, this type of treatment often involves high risks of breakage.

Heating the coated substrate after the deposition, for example by placing the substrate in an oven or a stove and subjecting the substrate to the infrared radiation delivered by conventional heating devices, such as infrared lamps, also presents drawbacks because these various methods contribute to heating without discriminating between the substrate and the thin layer. Heating the substrates to temperatures higher than 150° C. is generally liable to cause breakages in the case of large substrates (several meters wide) because it is impossible to ensure an identical temperature over the entire width of the substrate. Heating of the substrates also slows down the overall process, because it is necessary to wait for them to cool fully before it is possible to envisage cutting them or storing them, which is generally done by stacking the substrates on one another. Well-controlled cooling is furthermore indispensable in order to avoid generating stresses inside the glass, and therefore the possibility of breakages. Since such well-controlled cooling is very expensive, the anneal is generally not controlled sufficiently to eliminate the thermal stresses inside the glass, which causes an increased number of breakages on line. The anneal furthermore has the drawback of making it more difficult to cut the glass, since the cracks have less of a tendency to propagate linearly.

Heating of the substrates takes place in the event that the glazing is bended and/or tempered, because the glass is heated above its softening temperature (generally to more than 600° C. or even 700° C. for a few minutes). The tempering or bending therefore makes it possible to greatly reduce the resistivity of TCO-based layers. It would, however, be expensive to subject all glazing to such treatments. Furthermore, tempered glazing can no longer be cut, and certain stacks of thin layers do not withstand the high temperatures experienced during tempering of the glass.

Patent application WO 2008/096089, filed by the Applicant, describes a rapid annealing method which consists in supplying an extremely high power per unit area to the layer. The layer is heated extremely rapidly, without the heat having time to diffuse inside the substrate. It is thus possible to heat treat the thin layer without significantly heating the substrate, thereby limiting the risk of breakage linked with the thermal shock. For layers of the TCO type, the methods envisaged are methods employing flames, a plasma torch or a $CO_2$ laser, the wavelength of which is 10.6 micrometers. These methods make it possible to achieve resistivities which were previously attainable only by tempering the glass or by deposition at high temperature. The flaming technique is generally accompanied by transient bending, which is liable to affect the homogeneity of the treatment.

It is an object of the invention to provide an improved method making it possible to achieve even lower resistivities and obviate the aforementioned problems, while maintaining a high transmittance in the visible and near infrared ranges.

To this end, the invention relates to a method of obtaining a substrate coated on a first face with at least one transparent and electrically conductive thin layer based on at least one oxide, comprising the following steps:
said at least one thin layer is deposited on said substrate,
said at least one thin layer is subjected to a heat treatment step in which said at least one layer is irradiated with the aid of radiation having a wavelength of between 500 and 2000 nm and focused on a zone of said at least one layer, at least one dimension of which does not exceed 10 cm, said radiation being delivered by at least one radiation device placed facing said at least one layer, a relative displacement being created between said radiation device and said substrate so as to treat the desired surface, said heat treatment being such that the resistivity of said at least one layer is reduced during the treatment.

It has been found that this choice of wavelengths makes it possible to improve the effectiveness of the treatment according to the invention very substantially, and makes it possible to obtain layers with a much lower resistivity than those obtained by a $CO_2$ laser treatment as described in the aforementioned application WO 2008/096089.

The method according to the invention is preferably such that the resistivity of the transparent and electrically conductive layer, or its sheet resistance, is reduced by at least 60%, or 70% and even 75% relative to the resistivity or the sheet resistance measured before heat treatment.

The method according to the invention thus makes it possible to achieve very low resistivities, in particular less than or equal to $7.10^{-4}$ ohm.cm, in particular $6.10^{-4}$ ohm.cm, or even $4.10^{-4}$ or $3.10^{-4}$ ohm.cm, for layers of zinc oxide doped with aluminum and/or gallium. It is thus possible to obtain layers whose sheet resistance is less than or equal to 10 Ω for a thickness of less than or equal to 700 nm or 600 nm, or less than or equal to 400 nm or even 300 nm.

The treatment according to the invention also makes it possible to increase the light transmittance of the coated substrate by at least 5% or even 10% absolute. The light transmittance is calculated according to the standard ISO 9050:2003 on the basis of the transmission spectrum and normalized to a glass thickness of 3.2 mm. It is therefore possible for glass substrates coated with the TCO-based layer to obtain light transmittances of more than 80%, in particular 83%.

The light absorption is therefore greatly reduced, preferably to levels such that the absorption of a layer of zinc oxide doped with aluminum and/or gallium is less than 1.2%, in particular 1.0%, for a layer thickness of 100 nm. The light absorption of the layer is defined as being equal to the value 100% minus the light transmittance of the coated substrate, the light reflection on the substrate side (the side of the opposite face from the layer) and the light absorption of the uncoated substrate. The light absorption of the uncoated substrate corresponds in turn to the value 100% minus the light transmittance and the light reflection of the uncoated substrate. As throughout the text, the light transmittances and light reflections are calculated according to the standard ISO 9050:2003 on the basis of the transmission and reflection spectra, respectively.

The method according to the invention therefore makes it possible to obtain layers, in particular of zinc oxide doped with aluminum or gallium, having both a low resistivity or sheet resistance and a low light absorption (and therefore a high light transmittance). By way of example, it is thus possible to obtain glass substrates coated with a layer of zinc oxide doped with aluminum or gallium, the thickness of which is less than or equal to 600 nm and the sheet resistance less than equal to 10 Ω, the light transmittance of the coated substrate being greater than or equal to 80%. It is also possible to obtain glass substrates coated with a layer of zinc oxide doped with aluminum or gallium, the thickness of which is less than or equal to 400 nm and the sheet resistance less than or equal to 10Ω, the light transmittance of the coated substrate being greater than or equal to 83%. The thin layer of zinc oxide doped with aluminum and/or gallium preferably has after the heat treatment a resistivity of less than or equal to $7.10^{-4}$ ohm.cm, in particular $6.10^{-4}$ ohm.cm, and an absorption of less than or equal to 1.2%, in particular 1%, for a layer thickness of 100 nm (i.e. less than or equal to 5 or 6% for a layer with a thickness of 500 nm).

The method according to the invention does not generally employ a mechanism of crystallization by cooling from a molten material, on the one hand because this would make it necessary to heat the thin layer to extremely high temperatures in order to melt it, and on the other hand because it would be liable to modify the thicknesses and/or the refractive indices of the layers, and therefore their properties. This would modify in particular their visual appearance by generating inhomogeneities perceptible to the eye.

The method according to the invention has the advantage of heating only the thin layer (or the thin layers in the case of a stack), without significantly heating the substrate as a whole. It is thus no longer necessary to carry out slow and controlled cooling of the substrate before cutting or storing the glass. This method also makes it possible to integrate a heating device on existing continuous production lines, more particularly in the space lying between the exit of the vacuum deposition chamber of the magnetron line and the device for storing the glass by stacking. It is also possible in certain cases to carry out the treatment according to the invention actually inside the vacuum deposition chamber.

The treatment according to the invention is preferably such that the temperature of the opposite face of said substrate from said first face does not exceed 100° C. during the heat treatment. The use of focused radiation, in particular coming from laser irradiation, has the advantage of obtaining temperatures lower than 100° C., and often even lower than 50° C., on the opposite face from the first face of the substrate (that is to say on the uncoated face). This particularly advantageous characteristic is due to the fact that the heat exchange coefficient is very high, typically more than 400 W/(m².s). The surface power density of the radiation is preferably even greater than or equal to 10 kW/cm².

This very high energy density makes it possible to reach the desired temperature on the layer extremely rapidly (generally in a time less than or equal to 1 second) and consequently to limit the duration of the treatment commensurately, without the generated heat having time to diffuse inside the substrate. Thus, each point of the thin layer is preferably subjected to the treatment according to the invention (in particular heated to a temperature greater than or equal to 300° C.) for a duration generally less than or equal to 1 second, or even 0.5 second. Conversely, since the infrared lamps conventionally used (without a device for focusing the radiation) do not make it possible to achieve these high powers per unit area, the treatment time must be longer in order to reach the desired temperatures (often several seconds) and the substrate is then necessarily heated to high temperatures by diffusion of the heat, even if the wavelength of the radiation is adapted to be absorbed only by the thin layer and not by the substrate.

By virtue of the very high heat exchange coefficient associated with the method according to the invention, the part of the glass located 0.5 mm from the thin layer generally does not experience temperatures higher than 100° C. The temperature of the opposite face of the substrate from the first face preferably does not exceed 50° C., in particular 30° C., during the treatment.

The essential part of the energy supplied is therefore "used" by the thin layer in order to improve its resistivity characteristics.

Another advantage of the invention resides in the fact that the method makes the thin layer or the stack of thin layers undergo the equivalent of tempering. It so happens that certain stacks of thin layers have their optical properties (colorimetric coordinates, light or energy transmittance) modified when the glass is tempered. The method according to the invention then makes it possible to obtain untempered glass (therefore not having within it a stress profile specific to tempered glass, so that it can be cut) but substantially having the same optical properties as if it had been tempered.

The substrate is preferably made of glass or organic polymer material. It is preferably transparent, colorless or colored, for example blue, gray or bronze. The glass is preferably of the silica-soda-lime type, but it may also be made of glass of the borosilicate or alumino-borosilicate type. The preferred organic polymer materials are polycarbonate or polymethyl methacrylate. The substrate advantageously has at least one dimension greater than or equal to 1 m, or 2 m and even 3 m. The thickness of the substrate generally varies between 0.5 mm and 19 mm, preferably between 0.7 and 9 mm, the method according to the invention being particularly advantageous for the thinnest of substrates, the thickness of which is less than or equal to 4 mm, or even 2 mm. The substrate may be flat or convex. Particularly for photovoltaic applications, it is preferable for the glass substrate to have excellent planarity, in particular such that over a length of 1 m, the height difference between the highest peak and the deepest trough is less than or equal to 0.8 mm. The waviness is preferably of low amplitude, in the sense that over a length of 30 cm the height difference between the highest peak and the deepest trough is less than or equal to 0.3 mm.

Particularly for applications in the field of photovoltaics, it is preferable for the substrate to be made of extra-clear or ultra-clear glass, that is to say glass whose light or energy transmittance is greater than or equal to 90%, in particular 90.5%, or 91% and even 91.5%. The light transmittance, often abbreviated to "$T_L$", is calculated according to the standard ISO 9050:2003 and normalized to a glass thickness of 3.2 mm. The energy transmittance, abbreviated to "$T_E$", is also calculated according to the standard ISO 9050:2003 and normalized to a glass thickness of 3.2 mm. Such glasses are generally obtained by using primary materials low in iron, so that the iron oxide content in the final glass is at most 0.02%, in particular 0.01%. In order to further optimize this transmittance, it is preferable for the redox of the glass (that is to say the proportion by weight of ferrous iron expressed as FeO, and the total proportion of iron by weight expressed as $Fe_2O_3$), to be less than or equal to 20%, preferably 10% and even zero. Such redoxes or transmittances can be obtained in particular by oxidizing the iron with the aid of antimony or cerium oxide, or by adding to the glass tungsten oxide in a proportion by weight of between 0.1 and 2% and/or potassium oxide in a proportion by weight of between 1.5 and 10%, as taught by the applications FR-A-2 921 356 and FR-A-2 921 357. It is also possible to bubble an oxidizing gas through the glass bath after the fining step, as taught in the international application WO 2009/115725.

In photovoltaic applications, the dimensions of the glass substrate are typically as follows: 0.6*1.2 m² or 1.1*1.3 m², or alternatively 2.2*2.6 m² for a thickness of between 1.6 and 6 mm, in particular between 2.9 and 4 mm.

The glass substrate is preferably of the float type, that is to say capable of having been obtained by a method consisting in pouring the molten glass onto a bath of molten tin ("float" bath). In this case, the layer to be treated may equally well be deposited on the "tin" face or on the "atmosphere" face of the substrate. The "tin" and "atmosphere" faces of the substrate refer to the substrate faces which are respectively in contact with the atmosphere prevailing in the float bath and in contact with the molten tin. The tin face contains a small superficial quantity of tin which has diffused into the structure of the glass. It may also be obtained by rolling between two rollers, a technique which in particular makes it possible to imprint patterns on the surface of the glass. Certain patterns may be advantageous, as explained below.

With a view to maximizing the efficiency of the photovoltaic cell, the substrate is advantageously coated with an antireflection coating on its opposite face from the TCO-based thin layer. This coating may comprise one layer (for example based on porous silica with a low refractive index) or a plurality of layers: in the latter case, an alternating stack of layers based on dielectric material with low and high refractive indices ending with a low refractive index layer is preferred. This may in particular be a stack as described in the application WO 01/94989 or WO 2007/077373. The antireflection coating may also comprise as its last layer a self-cleaning and antisoiling layer based on photocatalytic titanium oxide, as taught in the application WO 2005/110937. A low reflection which lasts over time can thus be obtained.

Still with a desire to optimize the efficiency of the photovoltaic cell, the surface of the substrate may be textured, for example having patterns (in particular pyramidal patterns), as described in the applications WO 03/046617, WO 2006/134300, WO 2006/134301 or WO 2007/015017. These texturings are generally obtained through shaping the glass by rolling.

The TCO-based layer is preferably based on or constituted by at least one oxide selected from among the mixed oxides of indium and tin, the mixed oxides of indium and zinc, zinc oxide doped with gallium and/or aluminum and/or titanium and/or indium, titanium oxide doped with niobium and/or tantalum, cadmium or zinc stannate, tin oxide doped with fluorine and/or antimony. The doping levels, corresponding to the weight of doping oxide in relation to the total weight, are generally less than 10%, or even 5%. In the case of zinc oxide doped with aluminum, the doping level (that is to say the weight of aluminum oxide in relation to the total weight) is preferably less than 3%. In the case of gallium oxide, the doping level may be higher, typically between 5 and 6%.

The TCO-based layer is preferably based on or constituted by zinc oxide doped with gallium and/or aluminum and/or titanium and/or indium, in particular zinc oxide doped with aluminum, zinc oxide doped with gallium, zinc oxide doped with titanium, zinc oxide doped with indium, zinc oxide codoped with two or more of these atoms, for example with gallium and aluminum, or with aluminum and indium. This is because these layers can be obtained under good productivity conditions by the cathode sputtering method, in particular magnetic field enhanced (magnetron method).

The thickness of the TCO-based layer is preferably between 2 and 1000 nm, in particular between 50 and 800 nm, or between 150 and 600 nm.

The TCO-based layer according to the invention may be the only thin layer deposited on the substrate. It may also be contained in a stack of thin layers comprising thin layers generally selected from oxides, nitrides or metals. In the event that the treated thin layer is contained in a stack of thin layers, the method according to the invention can improve the crystallization properties of one or more of the thin layers of the stack.

The TCO-based layer may in particular be contained in a stack of thin layers comprising at least one underlayer acting as a barrier to the migration of alkali metals and/or at least one overlayer acting as a barrier to oxidation. This type of stack is described, for example, in the application WO 2007/018951.

As an underlayer acting as a barrier to the migration of alkali metals, mention may be made of dielectric materials such as nitrides, oxides or oxynitrides of silicon or aluminum, or any mixture thereof. The underlayer avoids in particular the detrimental effects of alkali metal ions migrating under the effect of an electric field during operation of the photovoltaic cell.

The transparent and electrically conductive thin layer is preferably not covered by an overlayer because the speed of the heating during the treatment entails very little migration of oxygen in comparison with an anneal or tempering. This is all the more advantageous in the event that the conductive layer has to act as an electrode and must therefore be in direct electrical contact with other functional layers (this is the case, for example, in photovoltaic or OLED applications): in the event of an anneal or tempering, the overlayer protecting against oxidation is necessary during the treatment and should subsequently be removed. By virtue of the method according to the invention, it is possible to do without this overlayer. It has furthermore been observed that the presence of an overlayer reduces the effectiveness of the treatment in certain cases.

As an alternative or in addition, it is possible for the transparent and electrically conductive thin layer not to be deposited on an underlayer because the speed of the heating during the treatment entails very little migration of alkali metal ions originating from the glass, in comparison with an anneal or tempering.

According to a preferred embodiment, the transparent and electrically conductive thin layer is covered before the heat treatment step with a thin layer based on carbon. The carbon is preferably of the graphite or amorphous type or contains a mixture of these two phases, and/or contains at least 50%, or even 100% of sp2 carbon. The thin carbon-based layer preferably consists of carbon, but may however be doped with a metal or partially hydrogenated. The thickness of the carbon layer is preferably less than 5 nm, in particular 2 nm and even 1 nm. Since carbon has a high capacity for absorption in the visible and infrared ranges, the carbon layer makes it possible to significantly increase the absorption of the laser radiation on the layer to be treated, and therefore increase the effectiveness of the treatment according to the invention. It is in particular possible to obtain the same resistivity reductions as in the absence of a carbon layer, but with a much higher speed of passage under the laser, typically 50% or 75% more. As an alternative, for the same speed of passage, it is possible to obtain even lower resistivities. The carbon, above all when it is mainly sp2 hybridized, in particular of the graphite or amorphous type, and all the more so when its thickness is small, is removed during the treatment, probably by oxidation into carbon dioxide, so that the residual absorption after treatment is minimal.

The thin carbon-based layer may be obtained by various techniques, in particular magnetic field enhanced cathode sputtering, for example with the aid of a graphite target in an argon atmosphere. Other deposition methods include chemical vapor deposition (CVD), arc deposition, evaporation, methods of the sol-gel type.

A plurality of radiation devices may be used, so long as they make it possible to focus the energy onto a small zone, typically onto a zone of which at least one dimension does not exceed 10 cm. Preferably, in order to further increase the energy density and the heat exchange coefficient, at least one dimension of the zone onto which the radiation is focused does not exceed 5 cm, in particular 1 cm, and even 5 mm or 1 mm, and even 0.5 mm. The other dimension may also be of the same order of magnitude (the case, for example, of a "point" laser beam), or much larger (the case, for example, of a linear laser beam), as explained in more detail in the rest of the text.

The wavelength of the radiation is between 500 and 2000 nm, preferably between 700 and 1300 nm.

Therefore, each radiation device is preferably a laser. The radiation focused onto the layer to be treated is in this case laser radiation.

A neodymium-doped YAG laser (yttrium aluminum garnet $Y_2Al_{15}O_2$) emitting radiation with a wavelength of about 1 micrometer in continuous wave or pulsed mode is highly suitable, in particular when the substrate does not absorb or absorbs little in this range of wavelengths, which is the case for clear glasses whose proportion by weight of iron oxide is 0.1% or less.

It is however preferable to use laser diodes emitting, for example, at a wavelength of the order of 808 nm, 880 nm, 915 or 940 nm, or 980 nm. In the form of linear arrays of diodes, very high powers can be obtained, which make it possible to reach power densities of more than 20 $kW/cm^2$, or even 30 $kW/cm^2$, on the layer to be treated. The glass absorbs less at these wavelengths than at the emission wavelength of the neodymium-doped YAG laser, which makes it possible to further increase the selectivity of the method.

For enhanced working simplicity, the lasers employed in the context of the invention may be fibered, which means that the laser radiation is launched into an optical fiber then delivered close to the surface to be treated by a focusing head. The laser may also be a fiber laser, in the sense that the amplification medium is itself an optical fiber.

The laser beam may be a point beam, in which case it is necessary to provide a system for displacing the laser beam in the plane of the substrate.

It is, however, preferable to use a radiation device emitting a linear laser beam which simultaneously irradiates all or some of the width of the substrate. This version is preferred because it avoids the use of expensive displacement systems, which are generally bulky and difficult to maintain. The linear laser beam may in particular be obtained with the aid of linear arrays of high-power laser diodes combined with focusing optics. The thickness of the line is preferably between 0.004 and 1 mm. The length of the line is typically between 5 mm and 1 m. The profile of the line may in particular be a Gaussian curve or a top hat.

The laser lines simultaneously irradiating all or some of the width of the substrate may be composed of a single line (in which case it irradiates the entire width of the substrate) or a plurality of lines, which are optionally separated. When a plurality of lines are used, it is preferable for them to be arranged so that the entire surface of the layer is treated. The or each line is preferably arranged perpendicularly to the direction of passage of the substrate, or arranged obliquely. The various lines may treat the substrate simultaneously, or in a time-offset fashion. What is important is that the entire surface to be treated is treated.

In order to treat all of the desired surface, it is also preferable to provide a relative displacement between on the one hand the substrate coated with the layer and on the other hand the radiation device, in particular the or each laser line. The substrate may thus be set in motion, particularly in translational progression in front of the fixed radiation device (in particular the fixed laser line), generally underneath but possibly above the laser line. This embodiment is particularly useful for continuous treatment. As an alternative, the substrate may be fixed and the radiation device (in particular the laser) may be mobile. Preferably, the difference between the respective speeds of the substrate and the radiation device (in particular the laser) is greater than or equal to 1 meter per minute, or 4 and even 8 meters per minute, this being in order to ensure a high processing speed.

When the substrate is displaced, particularly in translation, it may be set in motion with the aid of any mechanical conveyor means, for example with the aid of belts, rollers, translating plates. The conveyor system makes it possible to monitor and regulate the rate of displacement. If the substrate is made of flexible organic polymer material, the displacement may be carried out with the aid of a film feed system in the form of a succession of rollers.

The laser may also be set in motion so as to adjust its distance from the substrate, which may be useful in particular when the substrate is convex but not only in this case. In fact, it is preferable for the laser beam to be focused onto the coating to be treated so that the latter lies at a distance of less than or equal to 1 mm from the focal plane. If the displacement of the substrate or the laser is not precise enough in relation to the distance between the substrate and the focal plane, it is preferably expedient to be able to adjust the distance between the laser and the substrate. This adjustment may be automatic, and in particular regulated on the basis of measuring the distance upstream of the processing.

When the laser line is displaced, it is necessary to provide a system for displacing the laser, located above or below the substrate. The duration of the treatment is regulated by the displacement rate of the laser line.

All relative positions between the substrate and the laser are of course possible, so long as the surface of the substrate can be irradiated suitably. The substrate will most generally be arranged horizontally, but it may also be arranged vertically, or at any possible inclination. When the substrate is arranged horizontally, the laser is generally arranged so as to irradiate the upper face of the substrate. The laser may also irradiate the lower face of the substrate. In this case, it is necessary for the system supporting the substrate, optionally the system conveying the substrate when the latter is in motion, to be able to transmit the radiation into the zone to be irradiated. This is the case, for example, when conveyor rollers are used: since the rollers are separated, it is possible to arrange the laser in a zone lying between two successive rollers.

When both the faces of the substrate are to be treated, it is possible to use a plurality of lasers located on either side of the substrate, whether the latter is in a horizontal or vertical position or at any inclination.

As an alternative or in addition, the radiation may be delivered by infrared lamps combined with a focusing device. The focusing device may, for example, comprise at least one lens or at least one mirror, for example a parabolic mirror. This focusing makes it possible to concentrate the energy of the lamp onto a reduced zone of the substrate, thus making it possible to achieve high energy densities.

The radiation device, for example the linear laser, may be integrated into a layer deposition line, for example a line for magnetic field enhanced cathode sputtering (magnetron method), or a line for chemical vapor deposition (CVD), in particular plasma enhanced (PECVD), in a vacuum or at atmospheric pressure (APPECVD). The line generally comprises devices for handling the substrates, a deposition unit, optical inspection devices and stacking devices. The substrates advance, for example over conveyor rollers, successively in front of each device or each unit.

The radiation device, for example the linear laser, is preferably located just after the layer deposition unit, for example at the exit of the deposition unit. The coated substrate can thus be treated on-line after the deposition of the layer, at the exit of the deposition unit and before the optical inspection devices, or after the optical inspection devices and before the devices for stacking the substrates.

The radiation device may also be integrated into the deposition unit. For example, the device (in particular the laser) may be introduced into one of the compartments of a cathode sputtering deposition unit, in particular into a compartment where the vacuum is rarefied, particularly at a pressure of between $10^{-6}$ and $10^{-2}$ mbar. The laser may also be arranged outside the deposition unit, but in such a way as to treat a substrate located inside said unit. To this end, it is sufficient to provide a window which is transparent at the wavelength of the radiation being used, through which the laser beam will treat the layer. It is thus possible to treat a layer before subsequently depositing another layer in the same unit.

Whether the radiation device is outside or integrated into the deposition unit, these "on-line" methods are preferable to a serial method in which it would be necessary to stack the glass substrates between the deposition step and the heat treatment.

Serial methods may, however, be beneficial in the event that the heat treatment according to the invention is performed at a place different from that when the deposition is carried out, for example at a place where the glass transformation is carried out. The radiation device may therefore be integrated into lines other than the layer deposition line. It may, for example, be integrated into a line for manufacturing multiple glazing (in particular double or triple glazing), or a line for manufacturing laminated glazing. In these various cases, the heat treatment according to the invention is preferably carried out before making the multiple laminated glazing. The radiation device may also be integrated into a line for manufacturing photovoltaic cells, for example in order to reduce the resistivity of electrically conductive thin layers used as electrodes.

The thin layer may be deposited on the substrate by any type of method, in particular methods which produce mainly amorphous or nanocrystallized layers, such as the cathode sputtering method, in particular magnetic field enhanced (magnetron method), the method of plasma enhanced chemical vapor deposition (PECVD), the vacuum evaporation method or the sol-gel method. The thin layer obtained is, however, preferably a "dry" layer not containing an aqueous or organic solvent, as opposed to a "wet" layer obtained for example by the sol-gel method.

In the case of a layer obtained by the sol-gel method, precursors in solution (sol) are deposited on the substrate, the layer obtained subsequently having to be dried and annealed in order to eliminate any trace of solvent. In this case, the energy provided by the heating is mainly used to eliminate this solvent without affecting the crystallization properties of the layer, and it is consequently more difficult to improve said properties in a time short enough to avoid heating the substrate as well.

The thin layer is preferably deposited by cathode sputtering, in particular magnetic field enhanced (magnetron method).

For greater simplicity, the heat treatment of the layer is preferably carried out in air and/or at atmospheric pressure. It is, however, possible to heat treat the layer actually inside the vacuum deposition chamber, for example before a subsequent deposition.

The heat treatment is preferably such that each point of the thin layer is heated to a temperature of at least 300° C. while maintaining a temperature of less than or equal to 100° C. at each point of the opposite face of said substrate from said first face, so as to increase the crystallization factor of said thin layer while keeping it continuous and without a step of melting said thin layer. The TCO-based layer therefore remains continuous after the treatment.

In the context of the present invention, a "continuous thin layer" is intended to mean that the layer covers substantially all of the substrate or, in the case of a stack, all of the underlying layer. It is important for the continuous nature of the thin layer (and therefore its advantageous properties) to be preserved by the treatment according to the invention.

The term "point of the layer" is intended to mean a zone of the layer undergoing the treatment at a given time. According to the invention, all of the layer (and therefore every point) is heated to a temperature of at least 300° C. but not every point of the layer is necessarily treated simultaneously. The layer may be treated at the same time in its entirety, each point of the layer being simultaneously heated to a temperature of at least 300° C. As an alternative, the layer may be treated so that the various points of the layer or sets of points are successively heated to a temperature of at least 300° C., this second version being employed more often in the case of continuous implementation on an industrial scale.

The method according to the invention may be carried out on a substrate placed equally well horizontally or vertically. It may also be carried out on a substrate provided with thin layers on both of its faces, at least one layer of one the faces or each face being treated according to the invention. In the event that thin layers arranged on both faces of the substrate are treated according to the invention, it is possible to treat said thin second layers of each face either simultaneously or successively, by identical or different techniques, in particular when the nature of the layers being treated is identical or different. The case in which the treatment according to the invention is carried out simultaneously on both faces of the substrate is therefore indeed included in the scope of the invention.

After the heat treatment step, the method according to the invention may also comprise a thermal tempering step, the effect of which is to further reduce the resistivity of the TCO-based layer.

The invention also relates to the materials which can be obtained by the method according to the invention.

Specifically, the method according to the invention makes it possible to obtain TCO-based layers whose very low resistivity could be obtained only by heat treatments at the moment of deposition, for example deposition by cathode sputtering carried out on a substrate heated to more than 300° C.

A material according to the invention consists of a substrate coated with at least one transparent conductive thin layer based on mixed oxides of indium and zinc or tin, zinc oxide doped with aluminum or gallium, based on titanium oxide doped with niobium, based on cadmium and/or zinc stannate or based on tin oxide doped with fluorine and/or antimony.

In particular, a particularly beneficial material which it has not been possible to obtain by hitherto known methods consists of a substrate made of untempered glass or organic plastic material coated with at least one layer based on zinc oxide doped with aluminum and/or gallium. This material is characterized in that the layer has a resistivity of at most $6.10^{-4}$ ohm.cm, an absorption less than or equal to 1.2% for a layer thickness of 100 nm and a surface morphology having grains with a dimension of between 100 and 200 nm, which are in turn fragmented into a plurality of elementary grains, particularly into at least 2, 3 or 4 elementary grains. Such a morphology can be seen by scanning electron microscopy, particularly with a magnification×100000. The term grain does not prejudge the dimension of the crystallites or the domains which are coherent in X-ray diffraction.

The light absorption of the layer is defined as being equal to the value 100% minus the light transmittance of the coating substrate, the light transmission on the substrate side (the side of the opposite face from the layer) and the light absorption of the uncoated substrate. The light absorption of the uncoated substrate corresponds in turn to the value 100% minus the light transmittance and the light reflection of the uncoated substrate. As throughout the text, the light transmittances and light reflections are calculated according to the standard ISO 9050:2003 on the basis of the transmission and reflection spectra, respectively.

The sheet resistance of the layer may be measured in a known fashion with the aid of the 4-point method or van der Pauw method. The thickness of the layer may be determined in particular by a profilometer. The resistivity of the layer is then calculated by multiplying the sheet resistance and the thickness.

The annealing treatments of the prior art have made it possible to obtain at best resistivities of $7.5.10^{-4}$ ohm.cm, that is to say a sheet resistance of 10 ohms for a thickness of 750 nm. The grains have dimensions of between 100 and 200 nm, but are not fragmented.

Deposition by cathode sputtering on a substrate heated to at least 300° C. makes it possible to obtain resistivity values of between 2.5 and $5.10^{-4}$ ohm.cm. The grains obtained have large dimensions, in excess of 150 nm, but are not fragmented.

The unique morphology obtained by the treatment according to the invention is particularly surprising: it might be thought that the fragmentation of the grains would have the effect of reducing the mobility of the charge carriers and therefore of increasing the resistivity. It is, however, the opposite which occurs.

The materials according to the invention may quite clearly have any one of the characteristics described throughout the text (type of substrate, nature of the layers and optional underlayers or overlayers, thickness), separately or in combination with other characteristics which are also described herein. In particular, the various characteristics of the materials obtained, described in connection with the method according to the invention, are quite clearly also applicable to the material according to the invention.

The substrates (obtained) according to the invention may be used in single, multiple or laminated glazing, mirrors, glass wall coverings.

In the case of multiple glazing comprising at least two sheets of glass separated by a layer of gas, it is preferable for the thin layer to be arranged on the surface in contact with said layer of gas. Arranging the thin layer on the outer face of the glazing (and therefore in contact with the outside of the building), particularly in the case of triple glazing or double glazing which is inclined (for example integrated into a roof or a veranda), is however advantageous because the low emissivity of these layers makes it possible to avoid excessive cooling of the surface of the glazing during the night, and consequently to avoid the occurrence of condensation (mist and/or ice).

The substrates (obtained) according to the invention are preferably used in photovoltaic cells or glazing or solar panels, the thin layer treated according to the invention being for example an electrode based on ZnO:Al or Ga in stacks based on chalcopyrites (in particular of the CIS—$CuInSe_2$ type) or based on amorphous and/or polycrystalline silicon, or alternatively based on CdTe.

In the photovoltaic cell or glazing, the substrate according to the invention is preferably the front face substrate. It is generally orientated so that the electrically conductive transparent layer, which is used as a transparent electrode coating, lies below a main surface facing toward the photovoltaic material. This electrode coating is in electrical contact with the photovoltaic material arranged below, considering that the main arrival direction of the incident radiation is through the top.

This front face electrode coating thus generally constitutes the negative terminal (or hole collector) or positive terminal (or electron collector) of the solar cell, depending on the technologies employed. Of course, the solar cell also comprises an electrode coating on the rear face substrate, which then constitutes the positive or negative terminal, respectively, of the solar cell, but in general the electrode coating of the rear face substrate is not transparent.

The substrates according to the invention may also be used in display screens of the LCD (liquid crystal display), OLED (organic light emitting diodes) or FED (field emission display) type, the thin layer treated according to the invention being for example an electrically conductive layer of ITO. They may also be used in electrochromic glazing, the thin layer treated according to the invention being for example a transparent electrically conductive layer, as taught in the application FR-A-2 833 107.

The invention therefore also relates to photovoltaic glazing or cells, solar panels, display screens of the LCD (liquid crystal display), OLED (organic light emitting diodes) or FED (field emission display) type, electrochromic glazing, comprising at least one substrate according to the invention.

Figure 1:
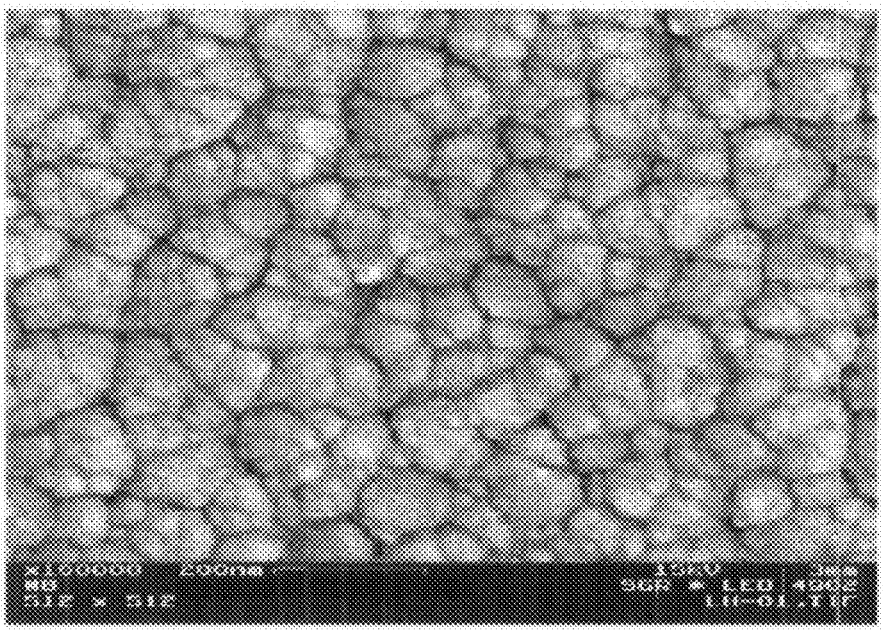
FIG. 1 is a scanning electron microscopy image of a thin layer of aluminum-doped zinc oxide treated according to the invention.
Figure 2:
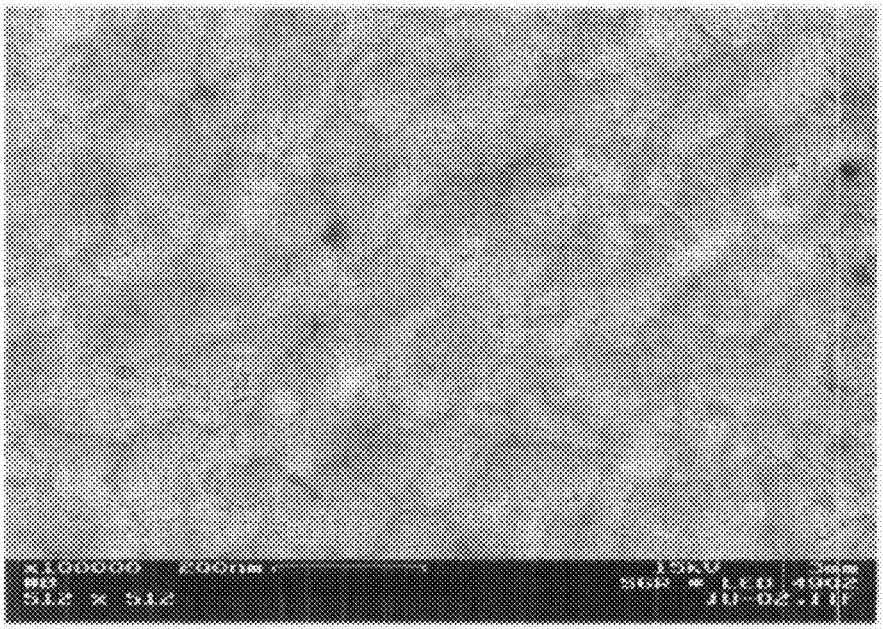
FIG. 2 is a scanning electron microscopy image of a thin layer of aluminum-doped zinc oxide deposited on a substrate heated to 300° C. during the deposition.
Figure 3:
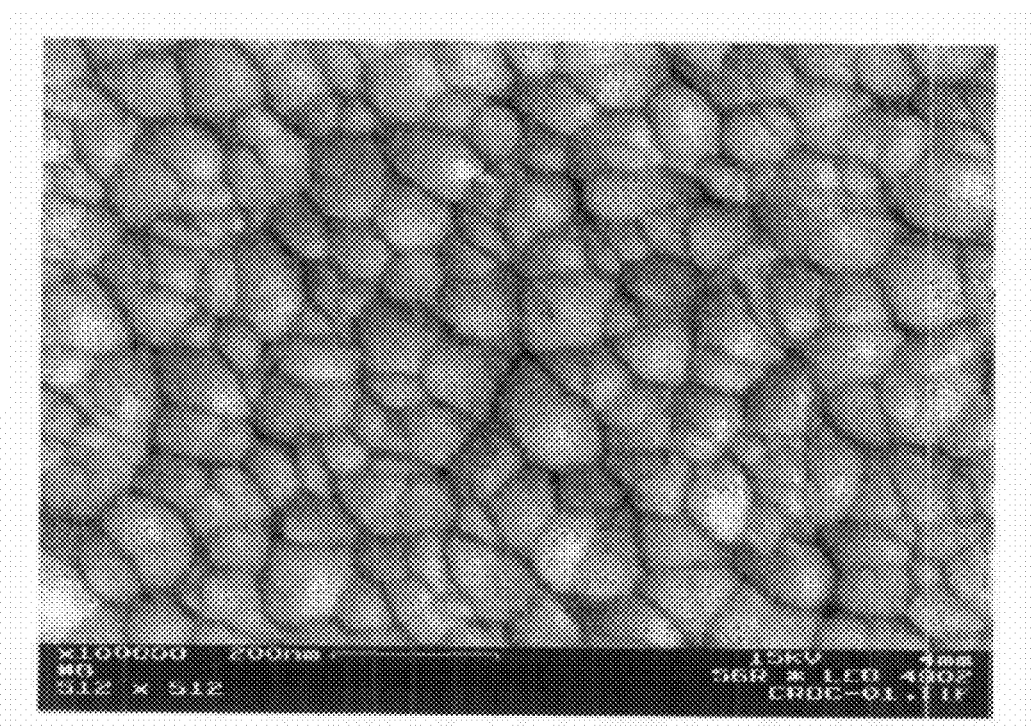
FIG. 3 is a scanning electron microscopy image of a thin layer of aluminum-doped zinc oxide annealed by traditional annealing methods.

By comparing these figures, it can be seen that the treatment according to the invention makes it possible to obtain a very particular morphology in which grains can be seen, one dimension of which lies between 100 and 200 nm and which are fragmented into a plurality of elementary grains.

The invention is illustrated with the aid of the following nonlimiting exemplary embodiments.

EXAMPLE 1 (COMPARATIVE)

This example corresponds to Example 12 of the application WO 2008/096089. A transparent conductive layer based on aluminum-doped zinc oxide with a thickness of 190 nm is deposited on a glass substrate by a magnetron method.

The layer is irradiated with the aid of a $CO_2$ laser emitting radiation with a wavelength of 10.6 micrometers. The laser is mounted on a system allowing rapid displacement of the laser in a direction perpendicular to the direction of passage of the substrate, so that the entire surface of the layer is affected by the treatment. The width of the spot on the surface of the layer is about 0.3 to 0.5 mm.

Table 1 below indicates the values of sheet resistance and light transmittance before and after treatment.

TABLE 1

| Transmittance (%) | | $R_S (\Omega)$ | |
|---|---|---|---|
| before | after | before | after |
| 74.4 | 78.3 | 94.8 | 40.5 |

The resistivity obtained has therefore decreased by 57% by virtue of the treatment, reaching a value of $7.7 \cdot 10^{-4}$ ohm.cm.

EXAMPLES 2 to 5

In these examples according to the invention, TCO layers of the aluminum-doped zinc oxide type are deposited. These layers are deposited by magnetron cathode sputtering on substrates with a thickness of 3 mm made of extra-clear glass marketed by Saint-Gobain Glass France under the brand SGG Diamant®. The deposition is carried out in a known manner with the aid of an aluminum-doped zinc oxide target in an argon atmosphere (nonreactive sputtering).

The coated substrates are then heat treated with the aid of a linear laser with a power of 450 W. The laser is fixed and the coated substrate progresses under the laser at speeds ranging from 3 to 9 meters per minute. The wavelength of the laser is 808 nm. Tests are also carried out with the aid of a laser emitting at 980 nm. The linear laser is obtained using linear arrays of laser diodes. During the treatment, the temperature of the opposite face of the substrate to the layer does not exceed 50° C.

Table 2 below indicates for each example:
the thickness of the layer in nm,
the doping level ($Al_2O_3$ content by mass),
the speed of advance of the substrate under the laser (in meters per minute),
the sheet resistance before and after treatment, denoted Rs and expressed in ohms,
the resistivity obtained by virtue of the treatment, expressed in ohm.cm,
the light transmittance of the coated substrate, denoted $T_L$ and calculated according to the standard ISO 9050:2003, expressed in %,
the light absorption of the layer, denoted $A_L$ and expressed in %.

TABLE 2

|  | 2 | 3 | 4 | 5 |
|---|---|---|---|---|
| Thickness (nm) | 550 | 700 | 500 | 800 |
| Doping level (%) | 2 | 2 | 1 | 2 |
| Speed (m/min) | 7 | 9 | 3 | 8 |
| $R_S$ (Ω) before treatment | 26.5 | 21.6 | 28.7 | 18.7 |
| $R_S$ (Ω) after treatment | 5.9 | 5.6 | 9.2 | 5.2 |
| Resistivity (Ω · cm) | $3.2 \cdot 10^{-4}$ | $3.9 \cdot 10^{-4}$ | $4.6 \cdot 10^{-4}$ | $4.2 \cdot 10^{-4}$ |
| $T_L$ (%) | 82.7 | 82.9 | 81.0 | 83.9 |
| $A_L$ (%) | 4.6 | 4.9 | 5.7 | 4.6 |

These examples show that the treatment according to the invention makes it possible to obtain resistivities significantly lower (often by a factor of close to two) than those obtained by the method known from WO 2008/096089. The resistivities and sheet resistances fall by about 70% relative to their initial values. The light transmittances are also higher, which is particularly beneficial for photovoltaic applications.

EXAMPLE 6

In this example according to the invention, a layer of indium tin oxide (ITO) is deposited by magnetron cathode sputtering on a glass sheet. The thickness of the layer is 500 nm.

The heat treatment is similar to that undergone by Examples 2 to 5.

Before treatment, the sheet resistance is 15 ohms, and it drops to about 4 to 5 ohms after the treatment.

EXAMPLES 7 to 11

The coated substrates of Examples 2 to 6 are in turn coated with a thin layer of carbon obtained by magnetron cathode sputtering, the thickness of which is of the order of 1 or 2 nm. The sputtering is carried out with the aid of a graphite target in an argon plasma.

The sheet resistance decrease is about 70 to 75%, as for Examples 2 to 6, but with a speed of passage of the substrate under the laser which is about 50 to 60% higher.

After the heat treatment, the carbon layer is no longer visible, the carbon probably having been oxidized into carbon dioxide gas.

The carbon layer therefore makes it possible to obtain very appreciable productivity gains.

The invention claimed is:

1. A method of obtaining a substrate coated on a first face with at least one transparent and electrically conductive thin layer based on at least one oxide, comprising:
    depositing the at least one thin layer on the substrate;
    subjecting the at least one thin layer to a heat treatment in which the at least one layer is irradiated with aid of radiation having a wavelength of between 700 nm and 1,300 nm, the radiation being delivered by at least one radiation device placed facing the at least one layer, said radiation device emitting a linear laser beam that simultaneously irradiates all of the width of the substrate, the emitted linear beam forming a laser beam line having a thickness between about 0.004 mm and about 1 mm and a length of at least 5 mm; and
    creating a relative displacement between the radiation device and the substrate so as to perform the heat treatment of the at least one thin layer, the heat treatment being such that resistivity of at least on layer is reduced during the heat treatment.

2. The method as claimed in claim 1, wherein the resistivity of the transparent and electrically conductive layer, or its sheet resistance, is reduced by at least 60% relative to the resistivity or the sheet resistance measured before heat treatment.

3. The method as claimed in claim 1, wherein the substrate is made of glass or organic polymer material.

4. The method as claimed in claim 1, wherein the at least one thin layer is based on at least one oxide selected from among mixed oxides of indium and tin, mixed oxides of indium and zinc, zinc oxide doped with gallium and/or aluminum and/or titanium and/or indium, titanium oxide doped with niobium and/or tantalum, cadmium or zinc stannate, tin oxide doped with fluorine and/or antimony.

5. The method as claimed in claim 4, wherein the at least one thin layer has after the heat treatment a resistivity of less than or equal to $7 \cdot 10^{-4}$ ohm·cm, and an absorption less than or equal to 1.2%, for a layer thickness of 100 nm.

6. The method as claimed in claim 1, wherein the at least one thin layer is covered before the heat treatment with a thin layer based on carbon, or of graphite or amorphous type.

7. The method as claimed in claim 1, wherein the laser beam line heats the at least one layer during the heat treatment to at least 300° C. without melting the at least one layer, and such that a temperature of an opposite face of the substrate from the first face does not exceed 100° C. during the heat treatment.

8. The method as claimed in claim 1, wherein the surface power density of the radiation is greater than or equal to 10 kW/cm$^2$.

9. The method as claimed in claim 1, wherein the at least one thin layer is deposited by magnetic field enhanced cathode sputtering.

10. The method as claimed in claim 1,
wherein the at least one thin layer comprises zinc oxide doped with aluminum and/or gallium, and
wherein the heat treatment forms a surface morphology having a plurality of grains on the at least one thin layer, each of the plurality of grains having a dimension of between 100 nm and 200 nm, and said each of the plurality of grains being fragmented into a plurality of elementary grains.

11. The method as claimed in claim 1, wherein the at least one radiation device is a linear array of laser diodes.

12. The method as claimed in claim 1, wherein the linear laser beam is composed of a single laser line or a plurality of laser lines.

13. The method as claimed in claim 1, wherein the at least one transparent and electrically conductive thin layer based on at least one oxide is a continuous thin layer deposited to cover substantially all of the substrate, and the thin layer remains continuous during the heat treatment.

14. The method as claimed in claim 4, wherein the at least one thin layer has after the heat treatment a resistivity of less than or equal to $6 \cdot 10^{-4}$ ohm·cm, and an absorption less than or equal to 1%, for a layer thickness of 100 nm.

15. The method as claimed in claim 1, wherein the heat treatment of the at least one thin layer is performed for less than or equal to 1 second.

16. The method as claimed in claim 1, wherein, during the heat treatment, the laser beam line heats each point of the at least one layer to at least 300° C. without melting the at least one layer, while maintaining a temperature that does not exceed 100° C. at each point of an opposite face of the substrate from the first face.

* * * * *